United States Patent
Kimura et al.

(10) Patent No.: US 7,352,002 B2
(45) Date of Patent: Apr. 1, 2008

(54) SEMICONDUCTOR DEVICE INCLUDING SEMICONDUCTOR THIN FILMS HAVING DIFFERENT CRYSTALLINITY, SUBSTRATE OF THE SAME, AND MANUFACTURING METHOD OF THE SAME, AND LIQUID CRYSTAL DISPLAY AND MANUFACTURING METHOD OF THE SAME

(75) Inventors: Yoshinobu Kimura, Yokohama (JP); Masakiyo Matsumura, Yokohama (JP); Yoshitaka Yamamoto, Yokohama (JP); Mikihiko Nishitani, Yokohama (JP); Masato Hiramatsu, Yokohama (JP); Masayuki Jyumonji, Yokohama (JP); Fumiki Nakano, Yokohama (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 0 days.

(21) Appl. No.: 11/403,938

(22) Filed: Apr. 14, 2006

(65) Prior Publication Data

US 2006/0197093 A1    Sep. 7, 2006

Related U.S. Application Data

(60) Division of application No. 10/755,303, filed on Jan. 13, 2004, now Pat. No. 7,087,505, which is a continuation of application No. PCT/JP03/04717, filed on Apr. 14, 2003.

(30) Foreign Application Priority Data

Apr. 15, 2002    (JP) .............................. 2002-112215

(51) Int. Cl.
*H01L 29/04*    (2006.01)

(52) U.S. Cl. ................... 257/49; 257/66; 257/E29.117; 257/E29.137; 345/90; 438/166; 438/486

(58) Field of Classification Search ..................... None
See application file for complete search history.

(56) References Cited

U.S. PATENT DOCUMENTS 5,294,811 A * 3/1994 Aoyama et al. .............. 257/59

(Continued)

FOREIGN PATENT DOCUMENTS

EP    0 650 197 A2    4/1995

(Continued)

OTHER PUBLICATIONS

Chang-Ho Oh et al., "Optimization of phase-modulated excimer-laser annealing method for growing highly-packed large-grains in Si thin-films", Applied Surface Sciene 154-155, (2000), pp. 105-111.

(Continued)

*Primary Examiner*—Sue A. Purvis
*Assistant Examiner*—Scott R. Wilson
(74) *Attorney, Agent, or Firm*—Oblon, Spivak, McClelland, Maier & Neustadt, P.C.

(57) ABSTRACT

A method of manufacturing a thin-film semiconductor device substrate includes a step of forming a non-single crystalline semiconductor thin film on a base layer, and an annealing step of irradiating the non-single crystalline semiconductor thin film with an energy beam to enhance crystallinity of a non-single crystalline semiconductor constituting the non-single crystalline semiconductor thin film. The annealing step includes simultaneously irradiating the non-single crystalline semiconductor thin film with a plurality of energy beams to form a plurality of unit regions each including at least one irradiated region irradiated with the energy beam and at least one non-irradiated region that is not irradiated with the energy beam.

16 Claims, 11 Drawing Sheets

U.S. PATENT DOCUMENTS

| | | | |
|---|---|---|---|
| 5,712,652 A | 1/1998 | Sato et al. | |
| 6,798,466 B2 * | 9/2004 | Takeichi et al. | 349/54 |
| 2002/0176151 A1 | 11/2002 | Moon et al. | |
| 2005/0059223 A1 | 3/2005 | Im | |
| 2006/0197093 A1 | 9/2006 | Kimura et al. | |

FOREIGN PATENT DOCUMENTS

| | | |
|---|---|---|
| JP | 3-46374 | 2/1991 |
| JP | 6-102530 | 4/1994 |
| JP | 6-104432 | 4/1994 |
| JP | 9-191114 | 1/1997 |
| JP | 2002-132184 | 5/2002 |

OTHER PUBLICATIONS

M. Matsumura, "Application of Excimer-Laser Annealing to Amorphous, Poly-Crystal and Single-Crystal silicon Thin-Film Transistors", phys. Stat. sol. (a) 166, 715 (1998), 715-728.

M. Matsumura et al. "Advanced excimer-laser annealing process for quasi single-crystal silicon thin-film devices", Thin Solid Films 337 (1999), pp. 123-128.

Chang-Ho Oh et al., "Preparation of Position-Controlled Crystal-Silicon Island Arrays by Means of Excimer-Laser Annealing" Jpn. J. Appl. Phys. vol. 37(1998), pp. 5474-5479, Part 1, No. 10, Oct. 1998.

U.S. Appl. No. 11/758,217, filed Jun. 05, 2007, Nakano et al.

* cited by examiner

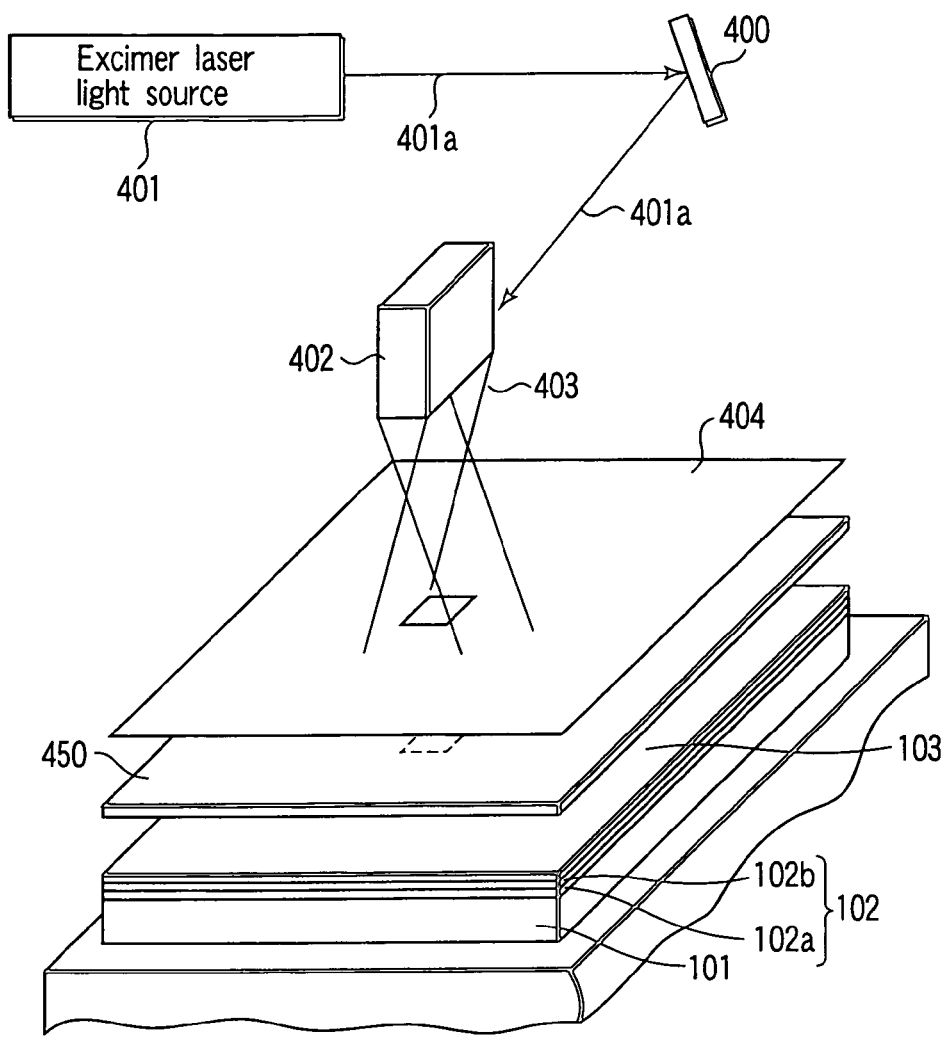
F I G. 2A
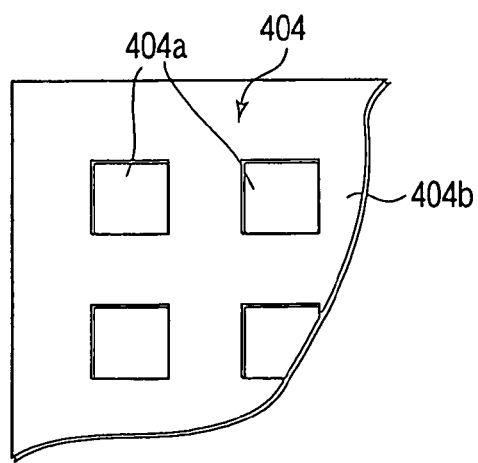
F I G. 2B

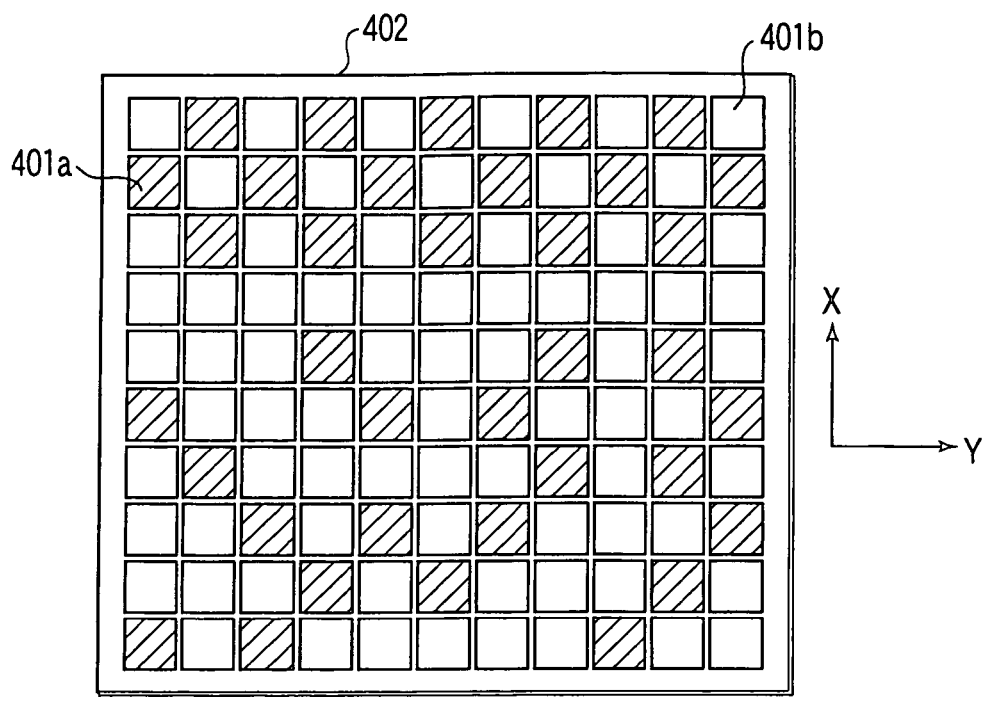
F I G. 4
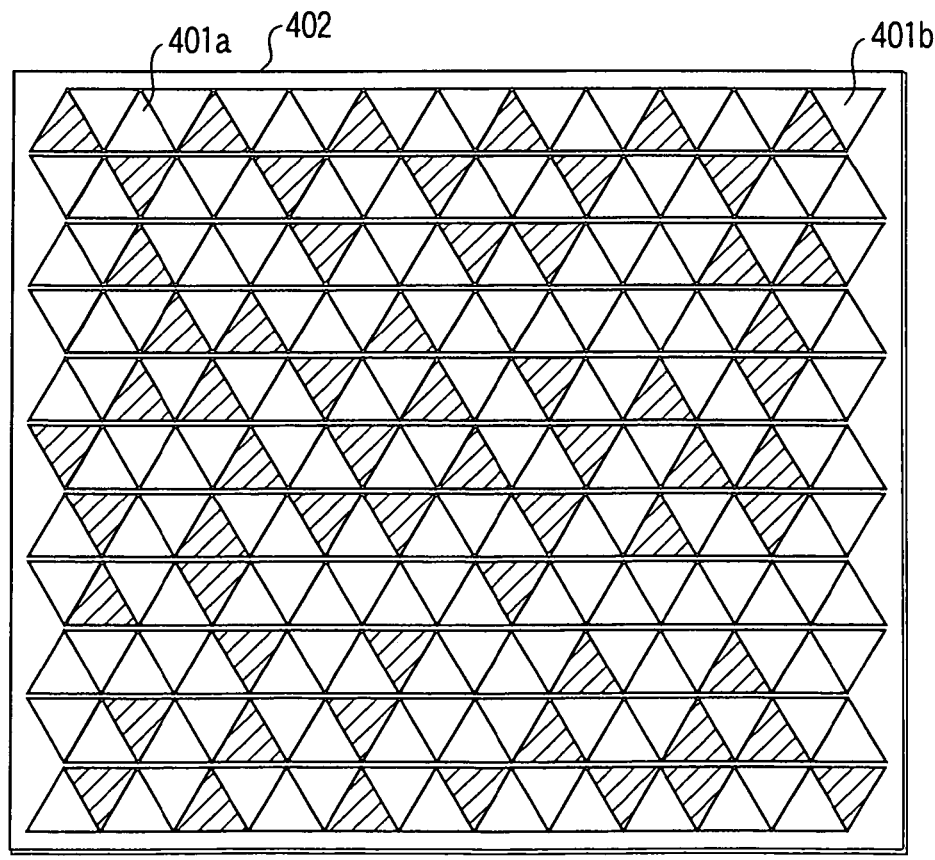
F I G. 5

450e : Phase 0
450f : Phase π/2
450g : Phase π
450h : Phase 3π/2

US 7,352,002 B2

SEMICONDUCTOR DEVICE INCLUDING SEMICONDUCTOR THIN FILMS HAVING DIFFERENT CRYSTALLINITY, SUBSTRATE OF THE SAME, AND MANUFACTURING METHOD OF THE SAME, AND LIQUID CRYSTAL DISPLAY AND MANUFACTURING METHOD OF THE SAME

CROSS-REFERENCE TO RELATED APPLICATIONS

This is a Divisional Application of U.S. patent application Ser. No. 10/755,303, filed Jan. 13, 2004 now U.S. Pat. No. 7,087,505, which is a Continuation Application of PCT application No. PCT/JP03/04717, filed Apr. 14, 2003, which was not published under PCT Article 21(2) in English.

This application is based upon and claims the benefit of priority from the prior Japanese Patent application No. 2002-112215, filed Apr. 15, 2002. The entire contents of Japanese Patent Application No. 2002-112215 and U.S. Pat. application Ser. No. 10/755,303 are incorporated herein by reference.

BACKGROUND OF THE INVENTION

1. Field of the Invention

The present invention relates to a semiconductor device including thin-film semiconductor layers which are different from one another in crystallinity, a substrate of the device, and a method of manufacturing the device and substrate.

2. Description of the Related Art

In thin-film semiconductor devices such as a crystalline thin-film semiconductor transistor (TFT), as well known, insulating thin films of semiconductor materials, such as silicon, are formed apart from one another on a substrate formed of an insulating material such as alkali glass, non-alkali glass, or quartz glass. A source region, a drain region, and a channel region disposed between the regions are formed on each insulating semiconductor thin film, and a gate electrode is disposed on each channel region via a gate insulating film to constitute TFT.

As shown in FIGS. 11A to 11E, the above-described thin-film semiconductor device is usually manufactured as follows.

A thin film 202 formed of a non-single-crystalline semiconductor (e.g., amorphous or polycrystalline silicon) is formed on a substrate 201 of an insulating material (e.g., glass) via an underlying layer (FIG. 11A). The whole surface of the thin film 202 is irradiated with an energy beam (e.g., excimer laser light) 203 to anneal/process this thin film 202, and the semiconductor in the thin film 202 is crystallized or recrystallized. That is, crystallinity of the semiconductor thin film 202 is improved (this annealed/processed semiconductor thin film is shown by reference numeral 204 in FIG. 11B). Here, crystallinity means "a ratio (percentage) of a mass of a crystal portion of a structure including the crystal portion and an amorphous portion to that of a whole specimen. Additionally, the amorphous portion can be removed or separated by etching, or can be evaluated with Raman spectrometry, and the like in the structure irradiated with the crystal portion and the amorphous portion microscopically exist in a mixed manner. That is, a single crystalline structure has a crystallinity of 1, and an amorphous structure has a crystallinity of 0." The semiconductor thin film 204 crystallized or recrystallized, that is, improved in the crystallinity is processed into a plurality of isolating semiconductor thin films 205 separated from one another by photolithography, etching, and the like. FIG. 11C shows only one insulating semiconductor thin film 205. Thereafter, a gate insulating film 206 formed of material such as silicon oxide ($SiO_2$) is formed on the substrate 201 including the surface of the insulating semiconductor thin film 205 (FIG. 11C). Moreover, a gate electrode 207 is formed on the gate insulating film 206, and next the gate electrode 207 is used as a mask to selectively implant impurity ions such as phosphor into the insulating semiconductor thin film 205 (FIG. 11D). As a result, a source region 209 and a drain region 210 doped with impurities, and a channel region 211 positioned between these regions are formed in the semiconductor thin film. Next, contact holes are formed in the portions of the gate insulating film 206 on the source region 209 and drain region 210. A source electrode 212 and a drain electrode 213 are formed so as to be electrically connected to the source region 209 and drain region 210 via the contact holes in the gate insulating film 206 (FIG. 11E). The TFT is completed in this manner.

The above-described anneal process for crystallizing or recrystallizing the non-single-crystalline semiconductor is an especially-important process in this manufacturing process of the TFT, because a crystalline state of the semiconductor produced by this process influences characteristics of the TFT. A representative example of the anneal process will be described with reference to FIG. 12.

In FIG. 12, reference numeral 301 denotes an excimer laser light source, and a laser light 301a emitted from this source is incident upon a beam homogenizer 302. As a result, the beam homogenizer 302 shapes the laser light 301a so as to obtain a uniform light intensity and to obtain a rectangular section (e.g., 150 mm×200 μm), and the light is incident onto the non-single-crystalline semiconductor thin film 202 on the substrate 201. As a result, the rectangular region irradiated with the laser light is crystallized. In this operation, when the substrate 201 is intermittently moved in a direction shown by an arrow, that is, in a direction crossing at right angles to a longitudinal direction of a slit-shaped section of the laser light, substantially the whole surface of the semiconductor thin film 202 is uniformly irradiated with the laser light, and crystallized.

In the subsequent process, as described with reference to FIGS. 11B to 11E, the crystallized semiconductor thin film is separated into insulating portions. For display devices such as a liquid crystal display, a plurality of TFTs functioning as switching devices with respect to pixels are formed on the same substrate to form an active matrix type circuit.

When an actual liquid crystal display is constituted, the TFT for the pixel is disposed for each pixel, and therefore needs to be formed on a center part (region denoted by 201a of FIG. 13) of the substrate 201. On the other hand, the TFT for a driving circuit constituting a driver circuit which drives the liquid crystal display is disposed on a vacant region of the substrate 201, that is, on a peripheral portion of the substrate 201 (region denoted by 201b of FIG. 13). Moreover, since the TFT for the pixel is different from the TFT for the driving circuit in characteristics required for the both, it is general to form the transistors in different processes. For example, since the TFT for the pixel requires a comparatively high withstand voltage, it is desirable to form the amorphous semiconductor thin film or the polycrystalline semiconductor thin film as a basis (channel). Since the TFT for the driving circuit requires fast switching characteristics, it is desirable to form the polycrystalline or single crystalline semiconductor thin film large in mobility as the basis.

Therefore, both types of TFTs need to be manufactured in the separate processes, and this has a disadvantage that the manufacturing is laborious.

Moreover, when the TFT for the driving circuit is disposed in the peripheral portion of the substrate, the TFT for the pixel has to be connected via a long data line, and there are also disadvantages that a signal loss is generated and that an operation speed is delayed.

BRIEF SUMMARY OF THE INVENTION

An object of the present invention is to provide a thin-film semiconductor device which is easily manufactured and which is superior in characteristics such as operation speed, a substrate array usable in the device, a method of manufacturing these, a liquid crystal display device, and a method of manufacturing the device.

According to one aspect of the present invention, there is provided a method of manufacturing a thin-film semiconductor device, comprising: a step of forming a non-single-crystalline semiconductor thin film on a substrate; and an annealing step of irradiating the non-single-crystalline semiconductor thin film with an energy beam to enhance crystallinity of a non-single-crystalline semiconductor constituting the non-single-crystalline semiconductor thin film, wherein the annealing step is performed to simultaneously irradiate the non-single-crystalline semiconductor thin film with a plurality of energy beams so that a plurality of unit regions are formed each including at least one irradiated region irradiated with the energy beam and at least one non-irradiated region that is not irradiated with the energy beam.

BRIEF DESCRIPTION OF THE SEVERAL VIEWS OF THE DRAWING

FIG. 2A is an explanatory view of an annealing step of the method, and FIG. 2B is a plan view of a part of a mask including through holes for use in this step;

FIG. 4 is a plan view showing a mirror array for use in the annealing step shown in FIG. 3;

FIG. 5 is a plan view showing a modification example of the mirror array shown in FIG. 4;

DETAILED DESCRIPTION OF THE INVENTION

A thin-film semiconductor device and a method of manufacturing the device according to one embodiment of the present invention will hereinafter be described especially with reference to FIGS. 1A to 1E.

Figure 1A:
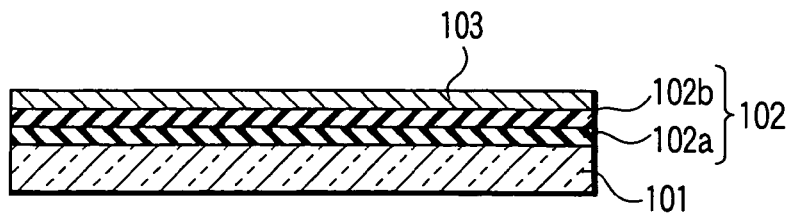
FIGS. 1A to 1E are explanatory views of each step of a method of manufacturing a thin-film semiconductor device according to one embodiment of the present invention.

As shown in FIG. 1A, an underlying layer 102 and amorphous semiconductor thin film 103 are successively formed on one flat surface of a transparent rectangular substrate 101 (only a part is shown in FIG. 1A) formed of an insulating material such as alkali glass, quartz glass, plastic, or polyimide using known film forming techniques such as a chemical gas phase development process and sputter process. The underlying layer 102 is formed by stacked films including, for example, an SiN film 102a having a thickness of 50 nm and an $SiO_2$ film 102b having a thickness of 100 nm. The SiN film 102a prevents impurities from the substrate 101 formed of glass, or the like from being diffused in the amorphous semiconductor thin film 103. The $SiO_2$ film 102b prevents nitrogen from the SiN film 102a from being diffused in the amorphous semiconductor thin film 103. The amorphous semiconductor thin film 103 is formed of semiconductor such as Si, Ge, or SiGe, Si in the present embodiment, having a thickness of about 50 nm to 200 nm.

Figure 1B:
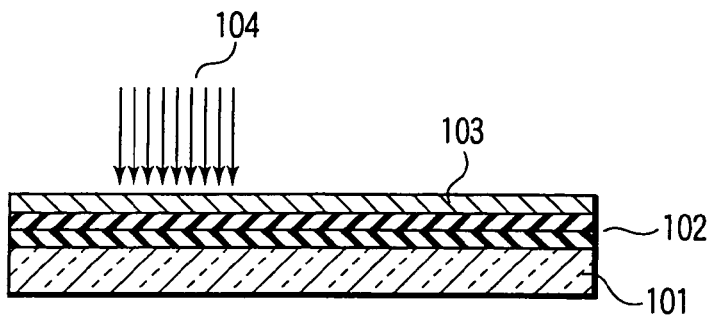
Figure 1C:
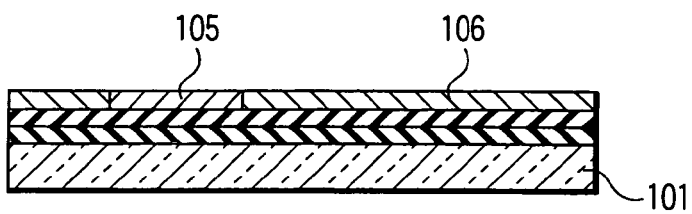

Next, as shown in FIGS. 1B and 1C, the surface of the amorphous semiconductor thin film 103 is selectively irradiated with an excimer laser light 104 which corresponds to energy beams, for example, of KrF, or XeCl excimer laser, as described later in detail, to form a plurality of unit regions each including a region 105 which has been irradiated (hereinafter referred to as the irradiated region) and which is disposed adjacent to a region 106 that is not irradiated (hereinafter referred to as a non-irradiated region) (for ease of understanding, FIG. 1B shows only one unit region including one irradiated region and a non-irradiated region). By this laser irradiation, the irradiated region 105 is annealing-treated and melted, and the amorphous semiconductor is transformed into a polycrystalline or single crystalline semiconductor, that is, crystallinity is improved. The amorphous semiconductor of the non-irradiated region 106 is maintained as such. The irradiated region 105 is a region for forming the TFT for a driving circuit, which is required to have fast switching characteristics, in a manufacturing process of the liquid crystal display. The non-irradiated region 106 is a region for forming the TFT for a pixel, which withstands a withstand high voltage.

Next, the photolithography technique is used to selectively etch the irradiated region 105 and underlying layer 102, and two first insulating regions 105a and one second insulating region 106a are formed. A gate insulating film 107 formed of $SiO_2$ and having a thickness of about 20 nm to 100 nm is formed on the substrate including the insulating regions 105a, 106a (exactly on the underlying layer 102) using a film forming technique similar to the above-described technique. Gate electrodes 108 are formed on portions of the gate insulating film 107 disposed opposite to middle portions of the insulating regions 105a, 106a. These gate electrodes 108 are formed by patterning of a layer of silicide or MoW.

Figure 1D:
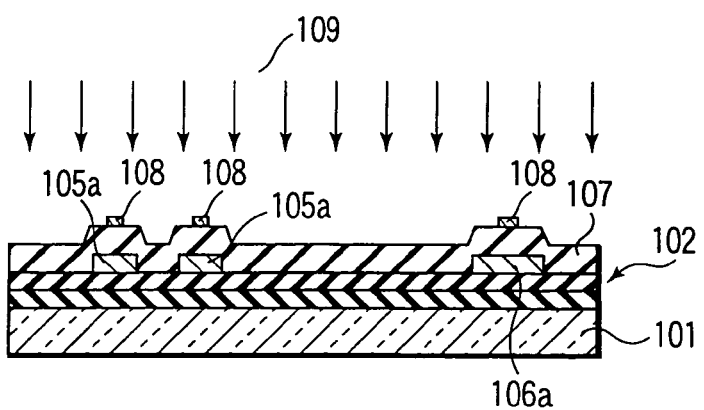

Next, as shown in FIG. 1D, the gate electrodes 108 are used as masks to implant impurity ions 109 into the insulating regions 105a, 106a, and a source region and drain region are formed via a channel region. The impurity ions include N-type impurities for forming an N channel MOS transistor, such as phosphor, and P-type impurities for forming a P channel MOS transistor, such as boron. The resulting device is annealed in a nitrogen atmosphere (at 450° C. for one hour), and the implanted impurities are activated.

Next, an interlayer insulating film 110 formed of $SiO_2$ is formed on the gate insulating film 107 including the gate electrode 108. The portions of the interlayer insulating film 110 and gate insulating film 107 on regions of the insulating regions 105a, 106a doped with the impurities (source and drain regions) are partially etched and removed to form contact holes.

Figure 1E:
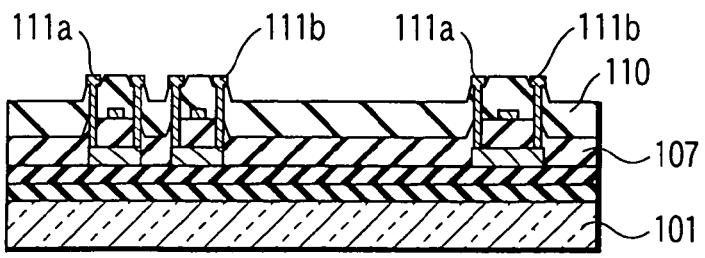

Next, as shown in FIG. 1E, source electrodes 111a and drain electrodes 111b electrically connected to the source and drain regions via the contact holes are formed on the gate insulating film 107 to complete the thin-film semiconductor device.

Next, the annealing step by the excimer laser light described with reference to FIGS. 1B and 1C will be described in detail with reference to FIGS. 2A and 2B.

In FIG. 2A, reference numeral 401 denotes an excimer laser light source, which is an emission device of the energy beams. The excimer laser light source may be a known source such as KrF, ArF, or XeCl. Moreover, an arbitrary power of the laser light source required for crystallizing the semiconductor thin film is usable. For example, when amorphous silicon is formed into microcrystalline silicon, a low power is used. Moreover, when amorphous silicon is formed into single crystal, a high power is usable. A laser light 401a emitted from the excimer laser light source is reflected by a mirror 400, and is incident upon a beam homogenizer 402. As a result, the beam homogenizer 402 shapes the laser light 401a in such a manner that intensity is uniform and a sectional shape is rectangular (e.g., 150 mm×200 μm), and allows the light to be incident upon a mask 404 fixed between the beam homogenizer 402 and the substrate 101. As shown in FIG. 2B, the mask 404 is formed by a substantially square metal plate 404b in which a plurality of square through holes having a width of about 5 to 10 μ, that is, micropores 404a are formed in a matrix form, that is, the micropores are aligned and formed in X and Y directions. The mask 404 is set in such a manner that a part of the incident light upon the mask 404 is incident upon the micropores 404a, passes through the micropores 404a, and is incident upon the substrate 101 via a phase shift mask 450 disposed in the vicinity of the front surface of the substrate 101 as described later. Moreover, a part of the light incident upon the surface of a portion other than the micropores 404a, that is, the surface of the plate 404b is reflected and is prevented from being incident upon the substrate 101. The metal plate 404b may also be constituted in a method other than a method of reflecting the incident light, for example, a method of absorbing the light to prevent the light from being incident upon the substrate 101. The shapes of the micropores 404a are square in the present embodiment, but other shape such as rectangular, circular, triangular, or hexagonal shape may also be used. Moreover, the micropores 404a are necessarily arranged regularly as shown in FIG. 2B, and may also be arranged irregularly. Alternatively, regularly and irregularly arranged micropores and/or micropores having different shapes may also be arranged in a mixed manner. The mask 404 has a substantially square shape, but does not have to necessarily have this shape, and may have substantially the same shape and dimensions as those of the section of the incident energy beam, and does not have substantially the same shape and dimensions as the substrate 101. For example, in the present embodiment, since an incident excimer laser light is a slit-shaped light having a 150 mm×200 μm section, the mask may have the same or smaller dimensions. In the present embodiment, since the substrate 101 is moved in X and Y directions, the mask may have dimensions much smaller than that of the substrate.

When the laser light 403 is incident upon the substrate 101, exactly the semiconductor thin film 103 on the substrate 101 via the mask 404 constituted as described above, the semiconductor thin film 103 is irradiated with the laser light having a pattern corresponding to that of the micropores 404a of the mask 404. That is, the semiconductor thin film 103 is irradiated with a plurality of laser beams passed through a plurality of mutually independent micropores 404a to form a plurality of rectangular irradiated regions and a non-irradiated region corresponding to the part of the laser light reflected by the mask 404. As described above, the amorphous semiconductor of the semiconductor thin film of the irradiated region transforms to a polycrystalline or single crystalline semiconductor, and the semiconductor of the non-irradiated region remains to be amorphous. In the present invention, in each mask, at least one irradiated region and at least one non-irradiated region disposed adjacent to the irradiated region forms one unit region. That is, a pixel region (strictly a region in which a pixel and a semiconductor device for the pixel are formed) is formed in an LCD, and a plurality of these unit regions are regularly or irregularly arranged on the substrate.

Both or one of the polycrystalline region (irradiated region) and amorphous region (non-irradiated region) of each unit region formed in the annealing step as described above is patterned, that is, so-called island-cut processed to form at least one single crystalline insulating thin film and at least one amorphous insulating thin film. That is, the semiconductor thin film is patterned so as to form the single crystalline insulating thin film in the vicinity of the amorphous insulating thin film in each unit region. Thereafter, as described with reference to FIGS. 1D and 1E, each insulating semiconductor thin film is constituted as a base to form the TFT so that the thin-film semiconductor device is completed.

For the thin-film semiconductor device manufactured in this manner, a plurality of, preferably a plurality of unit regions are formed in the vicinity of one another on a base layer (the substrate alone or a generic name of the substrate including some layer formed on the substrate as in the present embodiment). In each unit, at least one first semiconductor device is formed by the semiconductor thin film anneal-treated by the energy beam, and at least one second semi-conductor device if formed by the semiconductor thin film which is not anneal-treated. As a result, since the first and second semiconductor devices are formed on the basis of the semiconductor thin films formed of the same material having different crystallinity, characteristics of these devices differ. For example, the first semiconductor device has a high switching speed, because the polycrystalline semiconductor thin film of the device has a high mobility of an electron or a hole. For the second semiconductor device, the amorphous semiconductor is high electric field resistant. Therefore, when the semiconductor device is used as an LCD substrate array, the first semiconductor device is used as a TFT for a driving circuit, and the second semiconductor device is used as a TFT for a pixel. Then, the characteristics required for the liquid crystal display (LCD) can be satisfied. In this case, since the TFT for the driving circuit can be disposed remarkably in the vicinity of the TFT for the pixel, a line for electrically connecting both the transistors to each other can be reduced in length, and response can be enhanced. The irradiated region using the mask 404 is also effective for the positioning in manufacturing the first semiconductor device.

In the above-described embodiment, the mask 404 in which the micropores 404a are formed is used as means for dividing the energy beam into a plurality of beams to selectively irradiate the semiconductor thin film, but the present invention is not limited to this. An example will hereinafter be described, but substantially the same members as those of the above-described embodiment are denoted with the same reference numerals and the description thereof is omitted.

Figure 3:
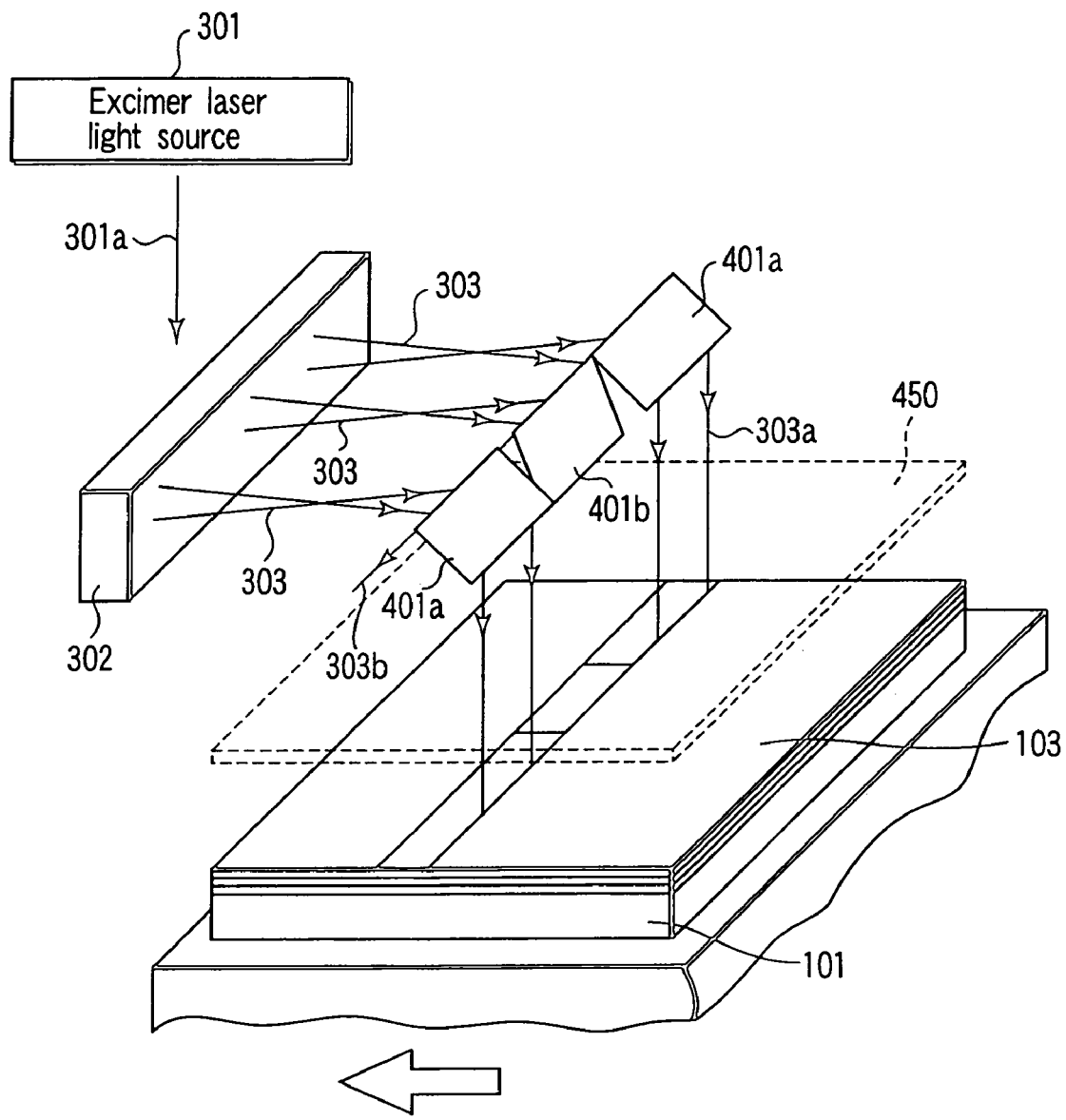
FIG. 3 is an explanatory view of a modification example of the annealing step.

FIG. 3 is an explanatory view of the annealing step in which a mirror array 402 shown in FIG. 4 is disposed between the beam homogenizer 302 and the substrate 101 instead of the mask 404. This mirror array 402 is constituted of first and second square micro mirrors 401a, 401b different from each other in angle in first and second groups, which are arranged in matrix on the same plane. These micro mirrors 401a, 401b may be formed by using a fine processing technique to process one surface of the same substrate, or the micro mirrors 401a, 401b formed individually beforehand may also be bonded to each other and formed. For the first micro mirrors 401a (hatched in FIG. 4 for clarity), an incidence angle with respect to the laser light is set so as to reflect portions 303 of the incident laser light in a direction of the substrate 101. For the second micro mirror 401b (shown in white in FIG. 4), the incidence angle with respect to the laser light is set so as to reflect the portions of the incident laser light 303 in a direction deviating from the substrate 101 (phase shift mask 450). As a result, portions 303a of the laser light reflected by the respective first micro mirrors 401a pass through the phase shifter 450, and are incident upon the semiconductor thin film 103 on the substrate 101 apart from each other to form the respective irradiated regions. Since a portion 303b of the laser light reflected by each second micro mirror 401b is not incident upon the semiconductor thin film 103 on the substrate 101, the non-irradiated region is formed. As a result, the irradiated and non-irradiated regions are arranged and formed in accordance with the arrangement of the micro mirrors 401a, 401b shown in FIG. 4 on the semiconductor thin film 103. In the present invention, at least one irradiated region and non-irradiated region are formed in the unit region. For example, one irradiated region disposed adjacent to one non-irradiated region in a Y or X direction may also be formed in one unit region. As shown and divided by bold lines in FIG. 4, two irradiated regions and two non-irradiated regions may also be formed in one unit region. Different numbers of irradiated regions and non-irradiated regions may also be formed in one unit region. In this embodiment, the micro mirrors 401a of the first group and the micro mirrors 401b of the second group are formed in such a manner that the mirrors are arranged alternately and regularly both in X and Y directions and the irradiated region and the non-irradiated region having the same size are alternately positioned. However, these micro mirrors 401a, 401b do not have to necessarily have the same size, and do not have to be regularly arranged. As a result, when the dimensions and arrangement of the micro mirrors 401a, 401b are selected, the unit region including the respective irradiated and non-irradiated regions having desired shapes in a desired arrangement can be formed on the semiconductor thin film. As a result, a crystal region having a size corresponding to that of the irradiated region, and an amorphous region having a size corresponding to that of the non-irradiated region can be formed in a desired pattern on the semiconductor thin film.

It should be noted that to move the substrate 101 in the X direction as shown by an arrow in FIG. 3, a plurality of micro mirrors 401a, 401b do not have to be arranged in the X and Y directions as shown in FIG. 4 and that at least one first mirror 401a and second mirror 401b may be disposed in the X direction.

The shapes of the micro mirrors 401a, 401b constituting the mirror array 402 are not necessarily limited to square shapes as shown in FIG. 4, and any shape may be used. For example, as shown in FIG. 5, a triangular or hexagonal shape may be used (in this case, for example, one hexagonal micro mirror can be arranged in a region where six triangular micro mirrors shown in FIG. 5 are aligned). In this case, the irradiated and non-irradiated regions are formed in the triangular or hexagonal shapes.

The mirror array 402 is constituted of the micro mirrors 401a, 401b whose reflection angles are fixed, but a rotatable mirror may be used in place of at least one of the first micro mirror 401a and the second mirror 401b. Thus the reflection angle can be optionally adjusted. One example of this mirror array will be described with reference to FIGS. 6A to 6C. In these figures, both the first micro mirrors 401a and the second micro mirrors 401b are generically denoted with reference numeral 401.

Figure 6A:
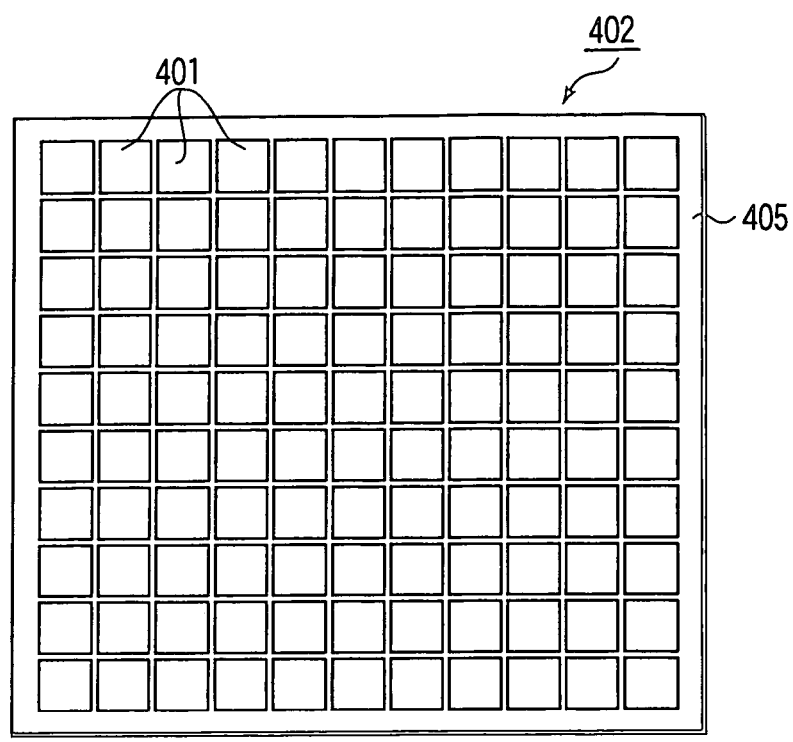
FIG. 6A is a plan view showing the modification example of the mirror array shown in FIG. 4.
Figure 6B:
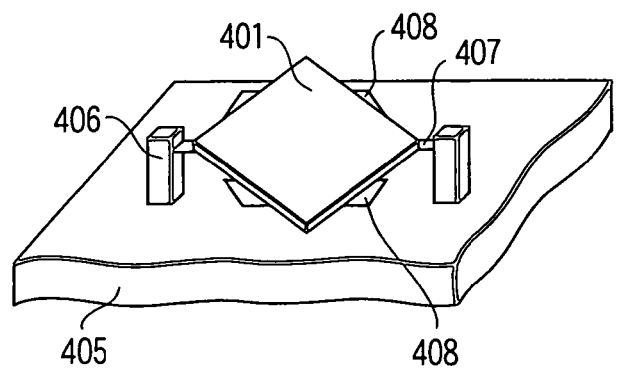
FIG. 6B is a perspective view schematically showing one micro mirror of the mirror array.
Figure 6C:
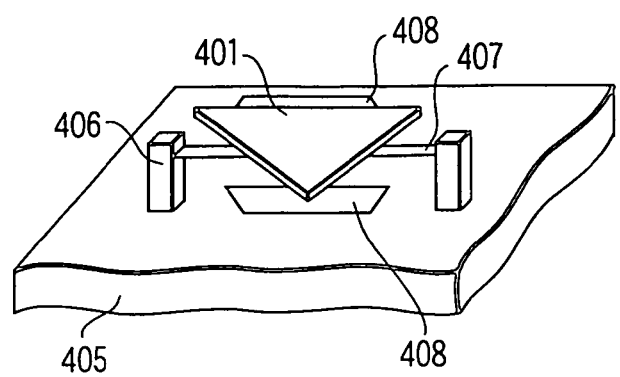
FIG. 6C is a perspective view showing a modification example of the micro mirror shown in FIG. 6B.

As shown in FIG. 6A, a plurality of square micro mirrors 401 (triangular micro mirrors 401 in FIG. 6C) are arranged in a matrix on one surface of a CMOS substrate 405. Each micro mirror 401 is formed of a thin plate of metal superior in reflectivity, such as aluminum. As shown in FIGS. 6B and 6C, a pair of support posts 406 are projected apart from each other at a predetermined interval with respect to each micro mirror on one surface of the CMOS substrate 405. These support posts 406 support ends of a rotation shaft 407 which rotatably supports the micro mirror 401 in a predetermined rotation range. A plurality of mirror electrodes 408 are disposed opposite to the micro mirrors 401 to be rotated on the surface of the CMOS substrate 405. These mirror electrodes 408 are connected to a driving source constituted of a power supply and control circuit (not shown). As a result, when a driving signal (driving current) of an optional level is supplied to the optional mirror electrode 408, the corresponding optional micro mirror 401 is rotated by an electrostatic force so as to obtain an optional angle. That is, the reflection angle of the desired micro mirror 401 is adjusted. A rotating mechanism of this mirror is formed using a technique of DLP (tradename; Digital Light Processing) marketed by Texas Instruments Inc.

As described above, the mirror array 402 including the micro mirrors 401 whose reflection angles are adjusted can be used to form the unit region including the irradiated and non-irradiated regions in a desired pattern and having a desired shape in one semiconductor thin film or mutually in the semiconductor thin films. Therefore, even when a different unit region is formed, the mirror array 402 does not have to be changed.

Figure 7A:
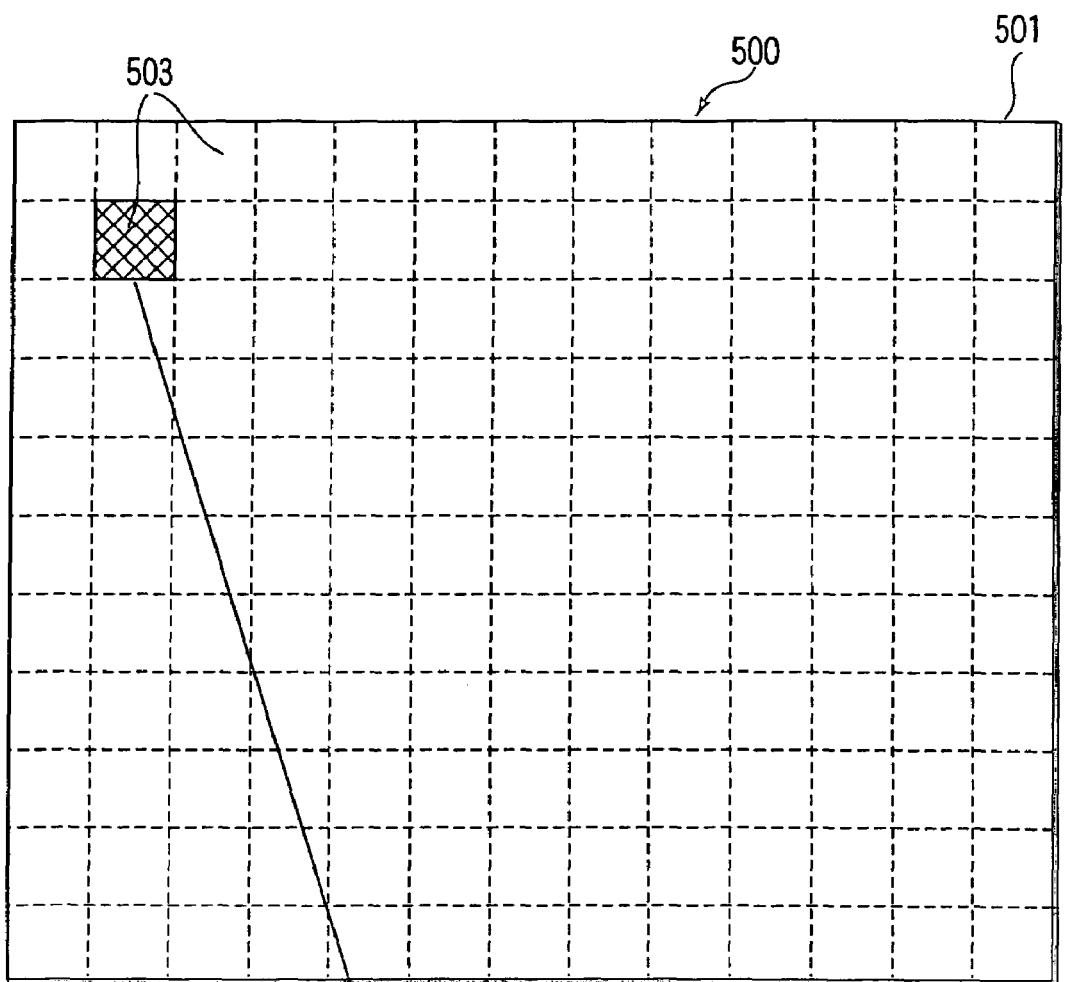
FIG. 7A is a diagram schematically showing one example of an LCD substrate which is the thin-film semiconductor device manufactured by the method of the present invention.
Figure 7B:
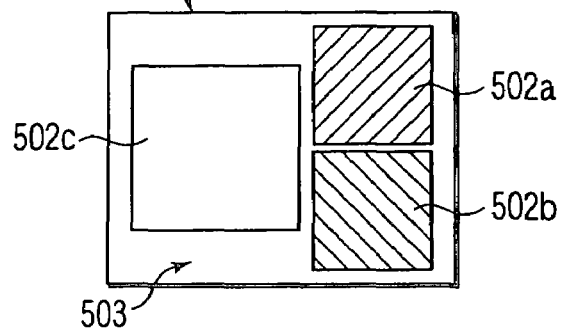
FIG. 7B is an enlarged view of one pixel region, that is, a unit region of FIG. 7A.

FIGS. 7A and 7B show a semi-finished product of an LCD substrate array 500 of the liquid crystal display which can be manufactured by the method of manufacturing the thin-film semiconductor of the present invention. This array includes a uniformly thick semiconductor thin film 501 formed on the underlying film formed on the transparent and rectangular substrate as occasion demands. This semiconductor thin film 501 is constituted by depositing an amorphous semiconductor having an entirely uniform thickness, such as silicon, on the underlying film. Next, an anneal technique described above in detail is used to selectively irradiate predetermined regions with the laser light to form first and second crystallized regions (irradiated regions) 502a, 502b together with an amorphous region (non-irradiated region) 502c in each unit region, that is, a pixel region 503.

The first and second crystallized regions 502a, 502b formed in each unit region 503 may both be polycrystalline or single crystal, or one may be polycrystalline and the other may be single crystalline. Crystallization into the polycrystalline and single crystalline semiconductors from the amorphous semiconductor may optionally be performed by setting the power of an energy beam to be high or by repeating the annealing step a plurality of times. For example, a first mask or mirror array may be used to irradiate only one irradiated region 502a of the unit region 503 with the laser light having a low power and to form the polycrystal. Next, a mask or mirror array having a different opening pattern or a different micro mirror pattern may be used to irradiate only the irradiated region 502b with the laser light having a high power and to form the single crystal. Here, the forming of the polycrystalline region and single crystalline crystal from amorphous has been described, but this has been described to facilitate the description. The crystallization into the polycrystal or single crystal is not necessarily required, and it is intended that a plurality of irradiated regions having different crystallinity be formable in each unit region in the present invention.

Figure 8A:
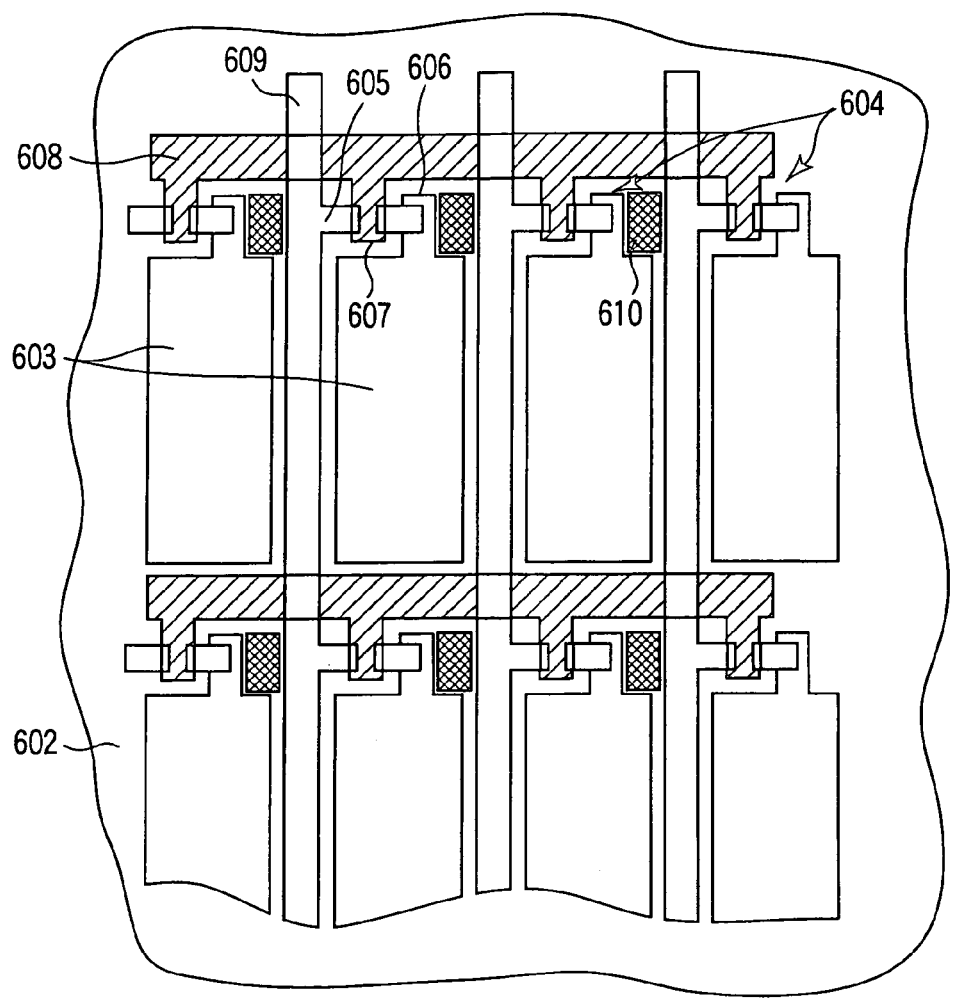
FIG. 8A is a diagram schematically showing a part of another example of an LCD substrate which is the thin-film semiconductor device manufactured by the method of the present invention.
Figure 8B:
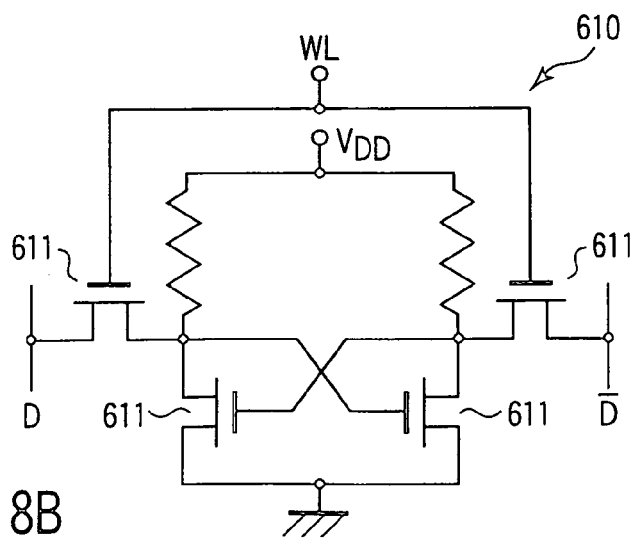
FIG. 8B is a diagram showing one example of a SRAM circuit formed in the device shown in FIG. 8A.

Next, the LCD substrate array formable by the method of the present invention will be described with reference to FIGS. 8A and 8B.

A plurality of pixel electrodes 603 and TFTs 604 are arranged in a matrix on an underlying layer 602 formed on the substrate of glass. Each TFT 604 includes a channel region, and a drain region and source region position on opposite ends of the channel region. A drain electrode 605 and a source electrode 606 are formed on the drain and source regions. The source electrode 606 is electrically connected to the pixel electrode 603. A gate electrode 607 is formed on the channel region via the gate insulating film. The gate electrodes 607 of the TFTs 604 disposed in rows are electrically connected to one another via a gate wiring 608. The drain electrodes 605 of the TFTs 604 disposed on columns are electrically connected to one another via a signal wiring 609.

A SRAM circuit 610 for temporarily storing a signal is electrically connected to the source electrode 606 and formed opposite to each TFT 604 on the underlying layer 102. As shown in FIG. 8B, the SRAM circuit 610 includes a known structure in which four TFTs 611 are used. In the LCD substrate array structured as described above, the TFTs 604 for the pixels and the TFTs 611 of the SRAM 610 can simultaneously be formed in the same process by the manufacturing method described with reference to FIGS. 1A to 1E. That is, in the annealing step shown in FIG. 1B, the TFT including the semiconductor thin film irradiated with the excimer laser light and transformed to the polycrystal is formed as the TFT 611 of the SRAM circuit 610, and the TFT including the semiconductor thin film which is not irradiated with the excimer laser light and which remains to be amorphous is usable as the TFT for the pixel 604. In this manner, two or more types of TFTs having a different crystallinity of the semiconductor thin film (channel region) are formable in the vicinity of each other (in each unit region) in the same step.

Instead of the SRAM circuit 610, other circuits using the semiconductor devices, such as a DRAM circuit, may also be formed using the method of the present invention. For the TFTs constituting the DRAM circuit, a single crystalline silicon thin film preferably forms the channel regions. For this, in the annealing step described with reference to FIG. 1B, a light source having a strong power may be used, or irradiation may be performed a plurality of times to transform amorphous silicon into single crystalline silicon.

Figure 9A:
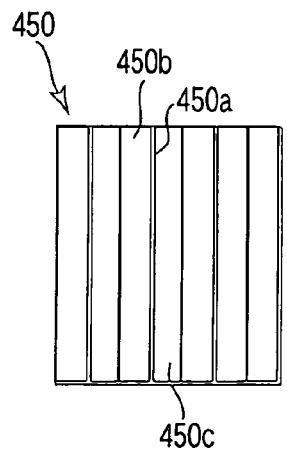
FIG. 9A is a plan view showing one example of a phase shift mask.

Next, the phase shift mask 450 will be described with reference to FIG. 9A.

For the phase shift mask 450, regions having different thicknesses are disposed adjacent to one another on transparent mediums such as a quartz base material, and the incident laser light is diffracted and interfered in a boundary of a step (phase shift portion 450a) between the regions to impart a periodic space distribution to the intensity of the incident laser light. The phase shift mask 450 includes first strip regions (phase regions) 450b and second strip regions (phase region) 450c whose phases are 0. The first and second regions are alternately arranged in such a manner that adjacent patterns have reverse phases (deviation of 180°) are π. These strip regions (phase shift line regions) have a width of 10 μm. Concretely, the phase shift mask 450 was prepared by etching the pattern of the rectangular quartz substrate having a refractive index of 1.5 in a depth corresponding to the phase π with respect to a 248 nm light, that is, a depth of 248 nm. The region formed to be thin by the etching forms the first strip region 450b, and the region that is not etched forms the second strip region 450c.

Figure 9B:
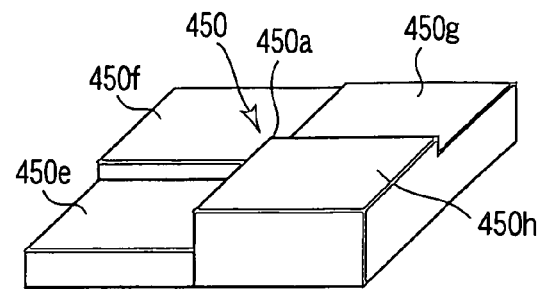
FIGS. 9B and 9C are a perspective view and plan view showing another example of the phase shift mask.
Figure 9C:
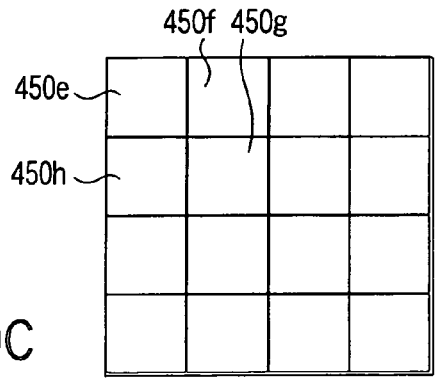
Figure 9D:
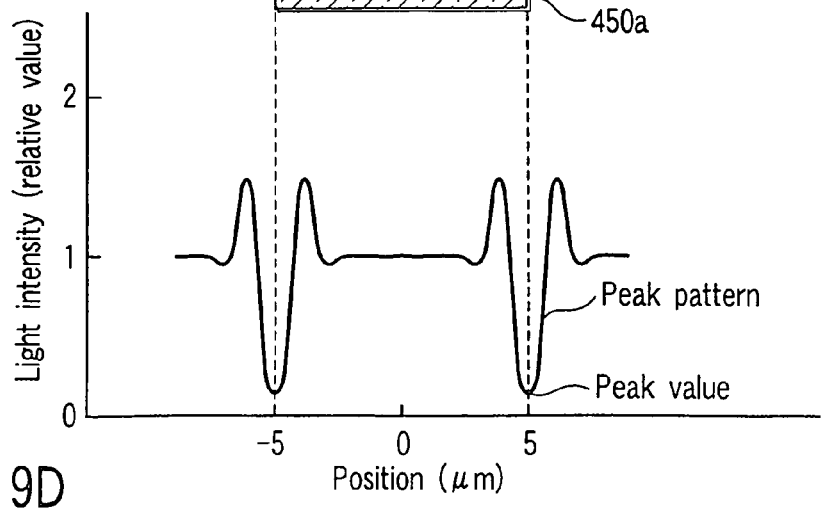
FIG. 9D is a graph of a light intensity distribution of an incident laser light upon the substrate obtained using the phase shift mask.

In the phase shift mask 450 constituted in this manner, the laser light passed through the thick second phase region 450c is delayed by 180° as compared with the laser light passed through the thin first phase region 450b. As a result, interference and diffraction occur between the laser fluxes, and an intensity distribution of the laser light is obtained as shown in FIG. 9D. That is, since the adjacent lights passed through the phase shift portion have reverse phases, the light intensity is minimized, for example, turns to 0 in a corresponding position between the regions. The region where the intensity is minimized or a region in the vicinity forms a nucleus during the crystallization. In the concrete example, the phase shift mask 450 including a plurality of phase shift portions 450a linearly extending in parallel with one another as shown in FIG. 9A is used, but this is not limited.

For example, phase shift lines may be allowed to cross at right angles to one another, and the phases 0 and π may also be arranged in a checkered lattice form. In this case, a region having a lattice form and a light intensity of 0 can be formed along the phase shift line. For this, since the nucleus of the crystal is generated in an optional position on the line, there is a problem that it is difficult to control the position/shape of crystal grains. Therefore, an intensity 0 region preferably has a dot form in order to control the generation of the crystal nucleus. Therefore, a phase shift amount of the phase shift lines crossing at right angles to each other is set to be less than 180°. Accordingly, the intensity does not completely turn to 0 (although decreasing) in the corresponding position of the phase shift line. Moreover, a sum of complex transmittances around an intersection is set to 0, and accordingly the intensity of the position corresponding to the intersection can be set to 0.

One example will be described with reference to FIGS. 9B and 9C. This mask 450 includes a plurality of sets of square patterns each constituted of four square regions 450e, 450f, 450g, 450h having different thickness from one, as in as shown in FIG. 9B. In each set, as shown in FIG. 9B, the first region 450e is thinnest, and has a phase of 0. The fourth region 450h is thickest, and the phase deviates from that of the first region 450e by $3\pi/2$. The phases of the second and third regions 450f, 450g having a thickness between the thicknesses of the regions 450e, 450h deviate from the first region by $\pi/2$, $\pi$.

In these masks, a portion where the first to fourth regions are disposed adjacent to one another, for example, a center point of a square pattern is a region having an intensity of 0. Therefore, since this point forms the nucleus of the crystal, the positions/shapes of the crystal grains can easily be controlled. A technique using this phase shift mask is described in the specification of the international application filed by the same applicant on Mar. 19, 2003, whose basic application is a Japanese application (Jpn. Pat. Appln. No. 2002-120312).

Figure 10A:
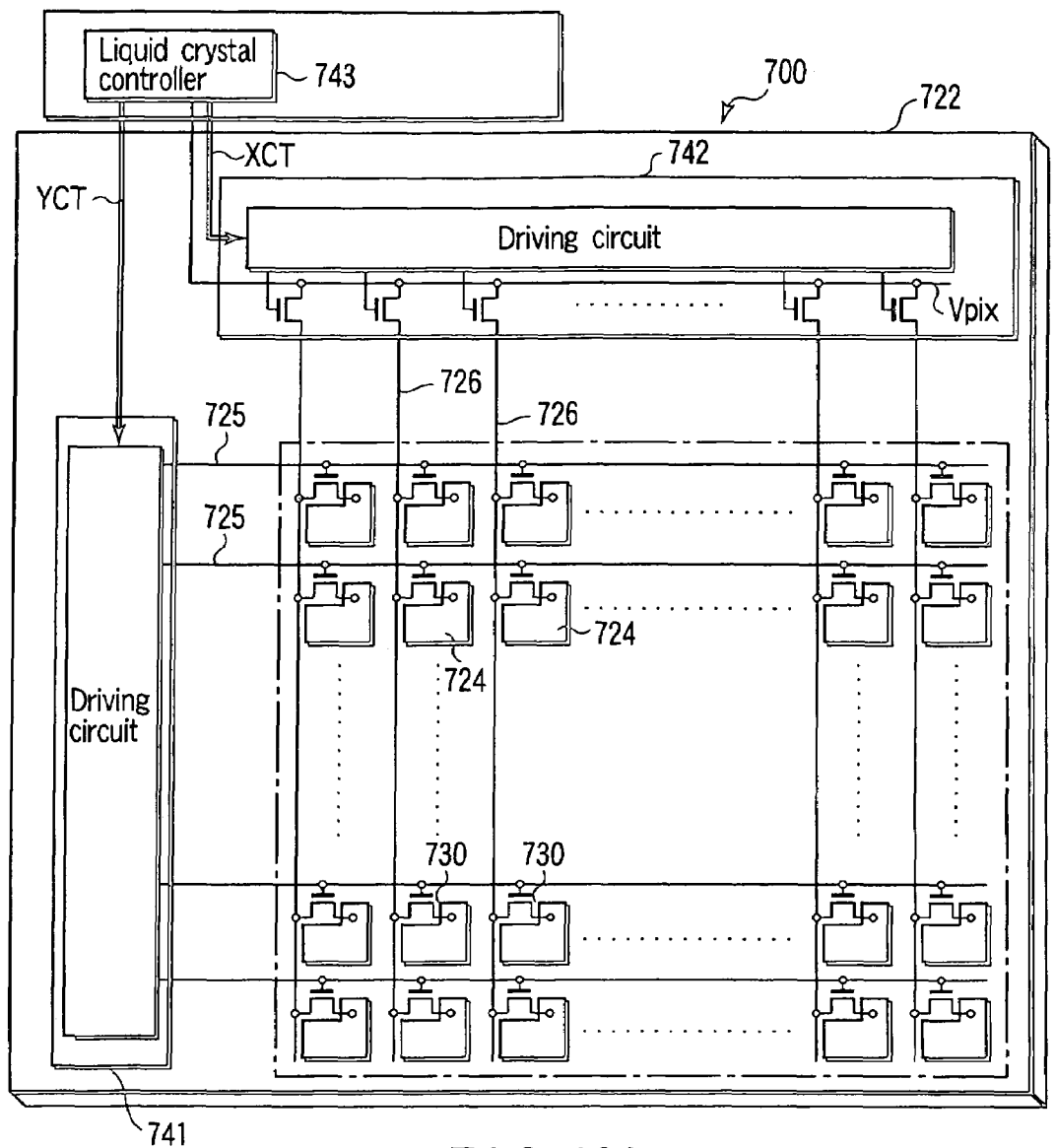
FIGS. 10A and 10B are a plan view showing an LCD substrate unit of a liquid crystal display manufactured by the method of the present invention, and a sectional view of the liquid crystal display.
Figure 10B:
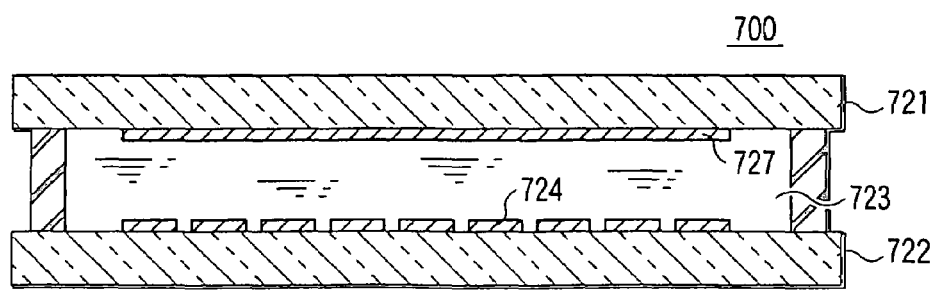
Figure 11A:
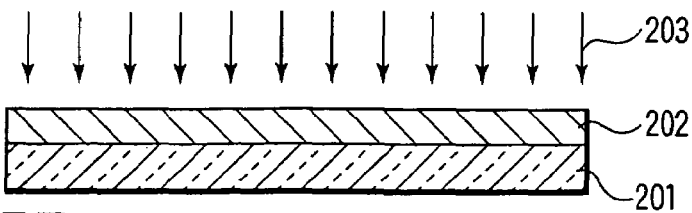
FIGS. 11A to 11E are explanatory views of each step of the method of manufacturing a thin-film semiconductor device in a related art.
Figure 11B:
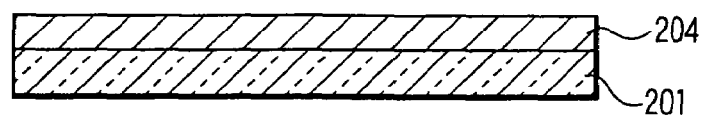
Figure 11C:
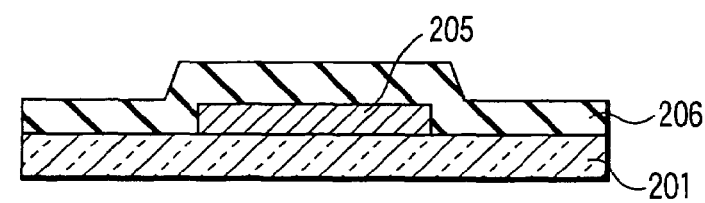
Figure 11D:
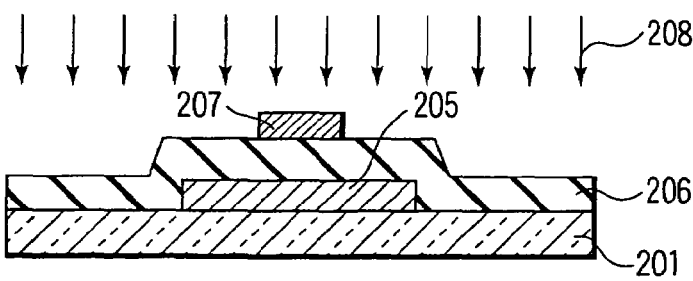
Figure 11E:
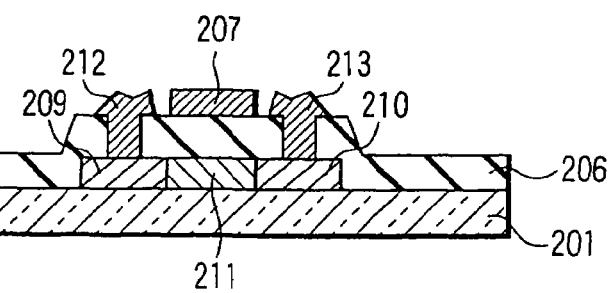
Figure 12:
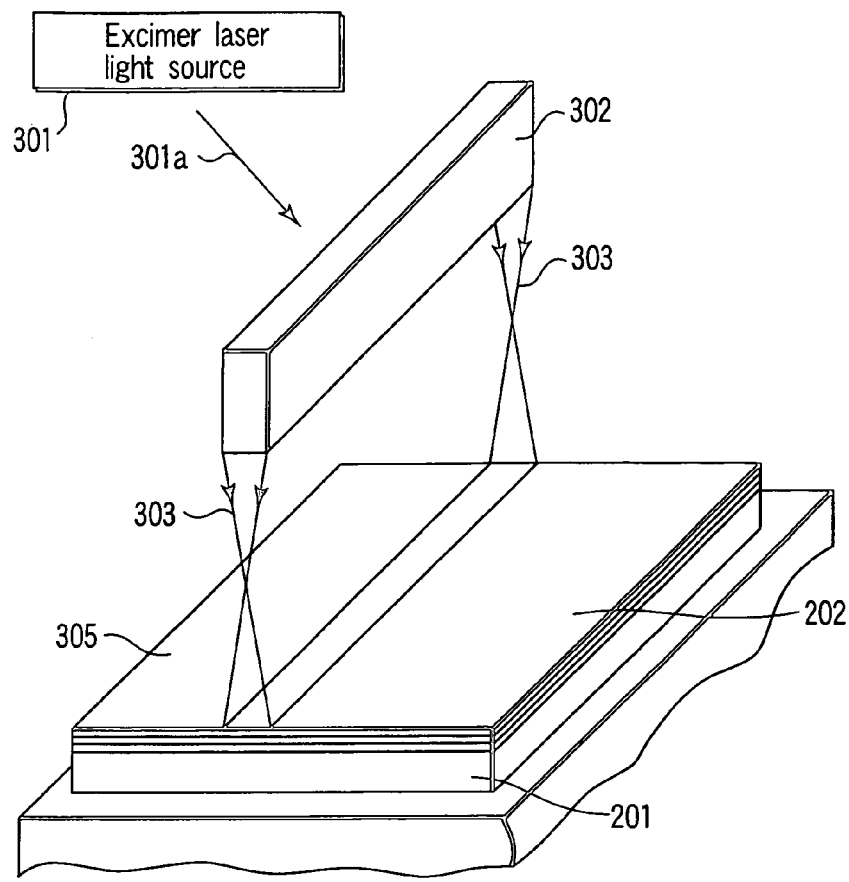
FIG. 12 is an explanatory view showing a conventional annealing step of the method.
Figure 13:
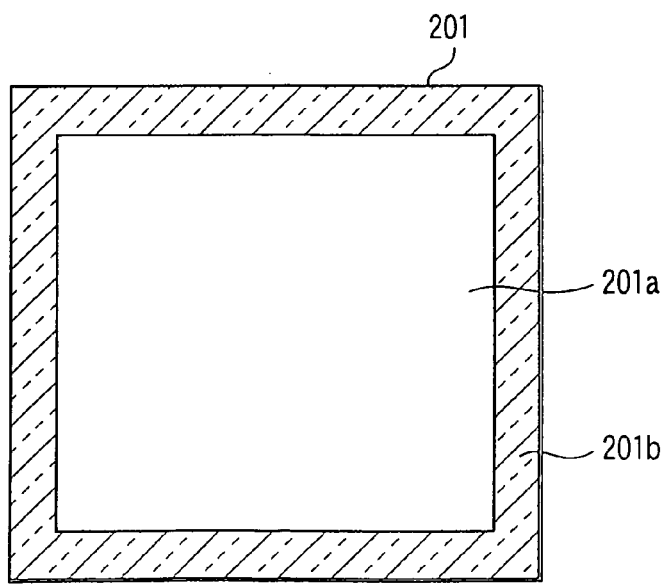
FIG. 13 is a diagram showing a range in which a TFT for a pixel is disposed and a range in which a TFT for a driving circuit is disposed.

FIGS. 10A and 10B show one example of the liquid crystal display manufactured using the technique of the present invention.

A liquid crystal display 700 includes: a pair of front/rear transparent base materials (base layers) 721, 722; a liquid crystal layer 723; pixel electrodes 724; scanning wirings 725; signal wirings 726; an opposed electrode 727; TFTs 730; and the like.

For example, a pair of glass plates can be used in one pair of transparent base materials 721, 722. These transparent base materials 721, 722 are bonded to each other via a frame-shaped seal material. The liquid crystal layer 723 is disposed in a region surrounded with the seal material between one pair of transparent base materials 721, 722.

On the inner surface of one transparent base material in one pair of transparent base materials 721, 722, for example, the rear-side transparent base material 722, a plurality of pixel electrodes 724 arranged in a matrix in row and column directions, a plurality of TFTs 730 electrically connected to the plurality of pixel electrodes 724, and the scanning wirings 725 and signal wirings 726 electrically connected to the plurality of TFTs 730 are disposed.

The scanning wirings 725 are disposed along the row direction of the pixel electrodes 724. One end of these scanning wirings 725 is connected to a plurality of scanning wiring terminals (not shown) disposed in one side edge of the rear-side transparent base material 722. The plurality of scanning wiring terminals are connected to a scanning line driving circuit 741.

The signal wirings 726 are disposed along the column direction of the pixel electrodes 724. One end of these signal wirings 726 is connected to the terminals (not shown) of the plurality of signal wirings 726 disposed in one side edge of the rear-side transparent base material 722. The plurality of signal wiring 726 terminals are connected to a signal line driving circuit 742.

The scanning line driving circuit 741 and signal line driving circuit 742 are connected to a liquid crystal controller 743, respectively. The liquid crystal controller 743 receives, for example, an image signal and synchronous signal supplied from the outside to generate a pixel video signal Vpix, a vertical scanning control signal YCT, and horizontal scanning control signal XCT.

One film-like transparent opposed electrode 727 is disposed opposite to a plurality of pixel electrodes 724 on the inner surface of the front-side transparent base material 721 which is the other transparent base material. On the inner surface of the front-side transparent base material 721, a color filter may be disposed opposite to a plurality of pixel portions in which the plurality of pixel electrodes 724 are disposed opposite to the opposed electrode 727. Moreover, a light shielding film may also be disposed opposite to a region between the pixel portions.

A polarizing plate (not shown) is disposed outside one pair of transparent base materials 721, 722. A plane light source (not shown) is disposed behind the rear-side transparent base material 722 in the transmission type liquid crystal display 700. It is to be noted that the liquid crystal display 700 may be of a reflective type or a semi-transmission reflective type.

In the above-described embodiment, the TFT has been described as the semiconductor device, but the present invention can also be applied to other semiconductor devices on the basis of the semiconductor thin film, such as a diode. Moreover, the excimer laser light is used as the energy beam, but a radiant ray is not limited to the excimer laser light as long as the crystallinity of the semiconductor can be improved by the irradiation. Furthermore, the mask or mirror array including the through holes is used to form a plurality of energy beams in the present embodiment, but this is not limited, and a plurality of energy beams obtained by another technique may also be used.

The liquid crystal display has been described as the display using the semiconductor device, but the present invention is not limited to this, and can also be applied to an organic EL display.

In accordance with a method of manufacturing a thin-film semiconductor device according to the present invention, semiconductor devices on the basis of at least two types of semiconductor thin films different from each other in crystallinity can be disposed adjacent to each other in each unit region to easily form the devices. As a result, at least two types of semiconductor devices required to have different performances are formed in each unit region, and the use is position in accordance with each performance. Since the semiconductor devices having different characteristics are disposed in the vicinity of each other in each unit, a wiring between these devices can be shortened, an operation speed can be raised, and a signal loss can be suppressed.

What is claimed is:

1. A thin-film semiconductor device substrate comprising:
a base layer; and
a semiconductor thin film formed on the base layer,
the semiconductor thin film comprising: a plurality of unit regions uniformly arranged in a matrix of rows and columns, each unit region including at least one first region and at least one second region and which are disposed adjacent to each other within said unit region and in which the first region is different from the second region in crystallinity, the at least one first region and the at least one second region of the semiconductor thin film having a same thickness.

2. The thin-film semiconductor device substrate according to claim 1, wherein the first region is formed of a crystalline semiconductor, and the second region is formed of an amorphous semiconductor.

3. The thin-film semiconductor device substrate according to claim 1, wherein the first and second regions of the unit region have same dimensions.

4. The thin-film semiconductor device substrate according to claim 1, wherein said plurality of unit regions are arranged on at least central and peripheral portions of the base layer.

5. The thin-film semiconductor device substrate according to claim 1, wherein the first region has a same thickness as that of the second region.

6. A thin-film semiconductor device comprising:
a base layer; and
a plurality of first and second transistors formed on the base layer,
wherein the first and second transistors include semiconductor thin films having different crystallinity, the semiconductor thin films having a same thickness, and at least one of the first transistors and at least one of the second transistors are formed in each of a plurality of unit regions.

7. The thin-film semiconductor device according to claim 6, wherein the first and second transistors of the unit region have same dimensions.

8. The thin-film semiconductor device according to claim 6, wherein the semiconductor thin film of the first transistor is formed by a crystalline semiconductor, and the semiconductor thin film of the second transistor is formed by an amorphous semiconductor.

9. A thin-film semiconductor device comprising:
a transparent base layer;
a plurality of first semiconductor devices arranged in a matrix form on the base layer and including first semiconductor thin films; and
a plurality of second semiconductor devices arranged in the vicinity of the respective first semiconductor devices and including second semiconductor thin films,
wherein the first semiconductor thin films are different from the second semiconductor thin films in crystallinity and have a same thickness, and at least one of the first semiconductor devices and at least one of the second semiconductor devices are formed in each of a plurality of unit regions and are located adjacent to each other.

10. The thin-film semiconductor device according to claim 9, further comprising third semiconductor devices arranged in the vicinity of the respective first semiconductor devices in the unit regions and including third semiconductor thin films, wherein the third semiconductor thin films have a crystallinity different from that of the first and second semiconductor thin films.

11. A liquid crystal display comprising:
first and second base layers including surfaces which are disposed apart from each other and are located opposite to each other;
a liquid crystal disposed between the surfaces disposed opposite to each other; a plurality of first and second electrodes arranged on the surfaces disposed opposite to each other; and
a pixel electrode and semiconductor thin films disposed on the opposite surface of one of the base layers, wherein these semiconductor thin films are disposed in a plurality of unit regions disposed adjacent to one another to form a first channel region of at least one first semiconductor device and a second channel region of at least one second semiconductor device, the first and second channel regions are electrically connected to each other, and the first channel region is different from the second channel region in crystallinity, wherein the first channel region has a same thickness as the second channel region.

12. The liquid crystal display according to claim 11, wherein the first semiconductor device includes a thin-film transistor for a pixel, in which at least the first channel region is formed of an amorphous semiconductor portion, and the second semiconductor device includes a thin-film transistor for a driving circuit, in which the second channel region is formed of a polycrystalline semiconductor portion or a single crystalline semiconductor portion.

13. The liquid crystal display according to claim 11, wherein the first and second electrodes define a plurality of pixel regions crossing at right angles to one another and arranged in a matrix form, and the first and second semiconductor devices are disposed in each pixel region.

14. A liquid crystal display comprising:
first and second substrates having inner sides which are disposed apart from each other and are located opposite to each other;
a liquid crystal layer disposed between the first and second substrates;
a plurality of first and second electrodes arranged on the inner sides of the first and second substrates;
a pixel electrode disposed on the inner side of the first substrate;
a plurality of first and second thin film transistors disposed on the inner side of the first substrate,
wherein at least one of the first thin film transistors and at least one of the second thin film transistors being disposed in each of a plurality of unit regions that are uniformly arranged in a matrix of rows and columns,
wherein each of the first and second thin film transistors include a semiconductor layer provided on the inner side of the first thin film transistor, a gate insulated layer provided on the semiconductor layer and a gate electrode provided on the gate insulating layer to face the semiconductor layer, and
wherein the semiconductor layers of the first thin film transistors are different from the semiconductor layers of the second thin film transistors in crystallinity.

15. The liquid crystal display according to claim 14, wherein the semiconductor layer of the plurality of first thin film transistor has a same thickness as the plurality of second thin film transistors.

16. The liquid crystal display according to claim 14, wherein said plurality of unit regions are arranged on at least central and peripheral portions on the inner side of the first substrate.

* * * * *